US012650651B2

(12) United States Patent
Liu et al.

(10) Patent No.: US 12,650,651 B2
(45) Date of Patent: Jun. 9, 2026

(54) EXPOSURE APPARATUS

(71) Applicant: CONTEMPORARY AMPEREX TECHNOLOGY (HONG KONG) LIMITED, Hong Kong (CN)

(72) Inventors: Xiaosong Liu, Ningde (CN); Keqiang Li, Ningde (CN); Zhiyang Wu, Ningde (CN); Yi Lu, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 132 days.

(21) Appl. No.: 18/612,799

(22) Filed: Mar. 21, 2024

(65) Prior Publication Data

US 2024/0264541 A1 Aug. 8, 2024

Related U.S. Application Data

(63) Continuation of application No. PCT/CN2022/136614, filed on Dec. 5, 2022.

(30) Foreign Application Priority Data

Dec. 21, 2021 (CN) .......................... 202111576057.2

(51) Int. Cl.
*G03F 7/00* (2006.01)
*G03F 7/20* (2006.01)

(52) U.S. Cl.
CPC ........ *G03F 7/70808* (2013.01); *G03F 7/2002* (2013.01); *G03F 7/2032* (2013.01);
(Continued)

(58) Field of Classification Search
CPC .......... G03F 7/20; G03F 7/2002; G03F 7/201; G03F 7/2022; G03F 7/2032;
(Continued)

(56) References Cited

U.S. PATENT DOCUMENTS 5,710,619 A * 1/1998 Jain ...................... G03F 7/70791
355/53
5,923,403 A * 7/1999 Jain ...................... G03F 7/70475
355/53
(Continued)

FOREIGN PATENT DOCUMENTS

CN 1816771 A 8/2006
CN 107463069 A 12/2017
(Continued)

OTHER PUBLICATIONS

Translation of Shimoda et al., JP 2000241648, Sep. 8, 2000.*
(Continued)

*Primary Examiner* — Peter B Kim
(74) *Attorney, Agent, or Firm* — ANOVA LAW GROUP, PLLC

(57) ABSTRACT

An exposure apparatus includes a conveying mechanism and an exposure mechanism. The conveying mechanism is configured to convey a substrate, a surface of the substrate being coated with photoresist. The exposure mechanism includes an exposure source and an exposure member. The exposure source is configured to provide light to the substrate. The exposure member includes an exposure section opposite the substrate, where the exposure section is located between the exposure source and the substrate and disposed in close proximity to the substrate, the exposure section has a light-transmitting portion that allows light to be incident on the substrate and a light-shielding portion that prevents light from being incident on the substrate, and the exposure section is configured to keep the light-transmitting portion and the light-shielding portion in synchronized movement with the substrate.

9 Claims, 2 Drawing Sheets

(52) U.S. Cl.
CPC .......... *G03F 7/7005* (2013.01); *G03F 7/7055*
(2013.01); *G03F 7/70733* (2013.01)

(58) Field of Classification Search
CPC ........ G03F 7/2035; G03F 7/24; G03F 7/7005;
G03F 7/7035; G03F 7/7055; G03F
7/70733; G03F 7/70808; G03F 7/70058
See application file for complete search history.

(56) References Cited

U.S. PATENT DOCUMENTS

| | | | | |
|---|---|---|---|---|
| 6,018,383 | A * | 1/2000 | Dunn | ................. G03F 7/70791 |
| | | | | 355/49 |
| 2018/0188645 | A1 | 7/2018 | Son et al. | |

FOREIGN PATENT DOCUMENTS

| | | |
|---|---|---|
| CN | 217181402 U | 8/2022 |
| CN | 217181403 U | 8/2022 |
| JP | H10293406 A | 11/1998 |
| JP | H11288080 A | 10/1999 |
| JP | 2000035677 A | 2/2000 |
| JP | 2000241648 A | 9/2000 |
| JP | 2002251103 A | 9/2002 |
| JP | 2005008412 A | 1/2005 |
| JP | 2007316589 A | 12/2007 |
| JP | 2009266526 A | 11/2009 |
| KR | 20130015502 A | 2/2013 |
| KR | 20190086884 A | 7/2019 |
| TW | 200834223 A | 8/2008 |

OTHER PUBLICATIONS

Translation of Sannomiya et al., JP 2000035677, Feb. 2, 2000.*
The European Patent Office (EPO) The Extended European Search
Report for Application No. 22909721.7 Jun. 7, 10, 2025 12 Pages.
The World Intellectual Property Organization (WIPO) International
Search Report and Written Opinion for PCT/CN2022/136614 Feb.
24, 2023 16 Pages (including translation).
China National Intellectual Property Administration (CNIPA) The
First Office Action for Application No. 202111576057.2 Dec. 23,
2025 19 Pages (including translation).

* cited by examiner

EXPOSURE APPARATUS

CROSS-REFERENCE TO RELATED APPLICATIONS

This application is a continuation of International Application No. PCT/CN2022/136614, filed on Dec. 5, 2022, which claims priority to Chinese patent application 202111576057.2, filed on Dec. 21, 2021 and entitled "EXPOSURE APPARATUS", which are incorporated herein by reference in their entirety.

TECHNICAL FIELD

This application relates to the field of exposure technologies, and in particular, to an exposure apparatus.

BACKGROUND

Exposure technology uses light to project patterns on an exposure plate onto a substrate through an optical system to achieve pattern transfer. Exposure technology is widely used in fields such as integrated circuit manufacturing and battery manufacturing. At present, the consistency between the patterns transferred to the substrate and the patterns on the exposure plate is relatively poor due to the use of exposure machines.

SUMMARY

Embodiments of this application provide an exposure apparatus, so as to improve exposure quality.

Embodiments of this application provide an exposure apparatus including a conveying mechanism and an exposure mechanism, where the conveying mechanism is configured to convey a substrate, a surface of the substrate being coated with photoresist; and the exposure mechanism includes an exposure source and an exposure member, the exposure source is configured to provide light to the substrate, and the exposure member includes an exposure section opposite the substrate, where the exposure section is located between the exposure source and the substrate and disposed in close proximity to the substrate, the exposure section has a light-transmitting portion that allows light to be incident on the substrate and a light-shielding portion that prevents light from being incident on the substrate, and the exposure section is configured to keep the light-transmitting portion and the light-shielding portion in synchronized movement with the substrate.

In the above technical solution, the part of the exposure member provided with the light-shielding portion and the light-transmitting portion moves in synchronization with the substrate, implementing exposure processing by the exposure mechanism during conveying of the substrate, thus improving the exposure efficiency. In addition, the light-shielding portion and the light-transmitting portion move in synchronization with the substrate. In other words, during conveying of the substrate, the light-shielding portion and the light-transmitting portion remain stationary relative to the substrate, which ensures that the patterns on the exposure member are fully exposed to the substrate at a high speed with good pattern consistency, thus improving the exposure quality.

In some embodiments of this application, the exposure mechanism further includes a drive assembly, the drive assembly being configured to drive the exposure member to move to keep the light-transmitting portion and the light-shielding portion in synchronized movement with the substrate.

In the above technical solution, the exposure member is driven to move by the drive assembly, which facilitates independent control of the movement of the exposure member and improves the flexibility of controlling various components of the exposure apparatus.

In some embodiments of this application, the drive assembly includes a first drive roller and a second drive roller spaced apart, the exposure member is wound around the first drive roller and the second drive roller, and the exposure member between the first drive roller and the second drive roller forms the exposure section.

In the above technical solution, the exposure member is wound around the first drive roller and the second drive roller, and the first drive roller and the second drive roller cooperate to drive the exposure member to move, which can improve the stability of the movement of the exposure member, and is helpful to ensure that the patterns on the exposure member are fully exposed to the substrate at a high speed, resulting in good pattern consistency. An exposure section is formed between the first drive roller and the second drive roller, and the light-shielding portion and the light-transmitting portion located on the exposure section synchronously move relative to the substrate for the same distance and time, so as to make the exposure time of each part of the substrate the same, thus improving the consistency of exposure patterns.

In some embodiments of this application, the drive assembly further includes a third drive roller and a fourth drive roller, the first drive roller, the second drive roller, the third drive roller, and the fourth drive roller are distributed at four corners of a rectangle, and the exposure member is wound around the first drive roller, the second drive roller, the third drive roller, and the fourth drive roller.

In the above technical solution, the exposure member is wound around the first drive roller, the second drive roller, the third drive roller, and the fourth drive roller, and the first drive roller, the second drive roller, the third drive roller, and the fourth drive roller cooperate to drive the exposure member to move, which can improve the stability of the movement of the exposure member, and is helpful to ensure that the patterns on the exposure member are fully exposed to the substrate at a high speed, resulting in good pattern consistency.

In some embodiments of this application, the exposure member is a closed-loop structure with ends connected.

In the above technical solution, the exposure member is a closed-loop structure with ends connected such that the exposure member moves in a circular manner, reducing the space occupied by the exposure member.

In some embodiments of this application, the drive assembly further includes a fifth drive roller, the fifth drive roller being provided on a side of the exposure section facing away from the substrate.

In the above technical solution, the fifth drive roller is provided on the side of the exposure section facing away from the substrate. Thus, the fifth drive roller can cooperate with the substrate to limit the shaking amplitude of the exposure section, thereby ensuring that the patterns on the exposure member are fully exposed to the substrate at a high speed with good pattern consistency.

In some embodiments of this application, the exposure source is located between the first drive roller and the second drive roller.

In the above technical solution, the exposure source is located between the first drive roller and the second drive roller, which makes the structure of the exposure mechanism more compact and reduces the space occupied by the exposure mechanism.

In some embodiments of this application, the exposure source is provided in plurality and the plurality of exposure sources are spaced apart.

In the above technical solution, the exposure source is provided in plurality, which can increase the exposure area of the substrate at a same time, thereby improving the exposure efficiency.

In some embodiments of this application, the light-shielding portion is provided in plurality, and the plurality of light-shielding portions are arranged in a rectangular array.

In the above technical solution, the plurality of light-shielding portions are arranged in a rectangular array. After they are irradiated by the exposure source, a relatively regular pattern can be formed on the substrate making it easy to determine whether the patterns on the exposure member are fully exposed to the substrate and whether the pattern consistency meets the requirements.

In some embodiments of this application, the exposure mechanism is provided in a quantity of two and the two exposure mechanisms are located on two sides of the substrate, respectively.

In the above technical solution, the two exposure mechanisms are respectively located on two sides of the substrate, which enables exposure on both sides of the substrate during the substrate conveying process and improves the exposure efficiency.

In some embodiments of this application, the conveying mechanism includes a discharge roller and a winding roller, the discharge roller being configured to release the substrate, the winding roller being provided downstream of the discharge roller, and the discharge roller being configured to wind the substrate released by the discharge roller.

In the above technical solution, the discharge roller and the winding roller cooperate in conveying the substrate, which can improve stability of the substrate conveying and realize exposure processing by the exposure mechanism during conveying of the substrate, thus improving the exposure efficiency.

In some embodiments of this application, the conveying mechanism further includes a sixth drive roller, the sixth drive roller being provided downstream of the discharge roller and upstream of the winding roller, and the sixth drive roller being configured to convey the substrate from the discharge roller to the winding roller.

In the above technical solution, the sixth drive roller is able to support the substrate located between the discharge roller and the winding roller, reducing the risk of the substrate being torn due to gravity during the conveying process. The provision of the sixth drive roller can also improve the stability of the substrate conveyance.

In some embodiments of this application, the substrate is a current collector coated with photoresist, the exposure member is a mask film, and/or the exposure source is an ultraviolet light source.

In the above technical solution, the substrate is a current collector coated with photoresist. Using the exposure apparatus to carry out exposure processing can improve the production efficiency of the electrode plate. The exposure member is a mask film and the exposure source is an ultraviolet light source, both of which are low-cost and easily obtainable components, thus reducing the production cost.

BRIEF DESCRIPTION OF DRAWINGS

To describe the technical solutions of the embodiments of this application more clearly, the following briefly describes the accompanying drawings required for describing the embodiments. It is appreciated that the accompanying drawings below show merely some embodiments of this application and thus should not be considered as limitations on the scope. Persons of ordinary skill in the art may still derive other related drawings from the accompanying drawings without creative efforts.

Figure 1:
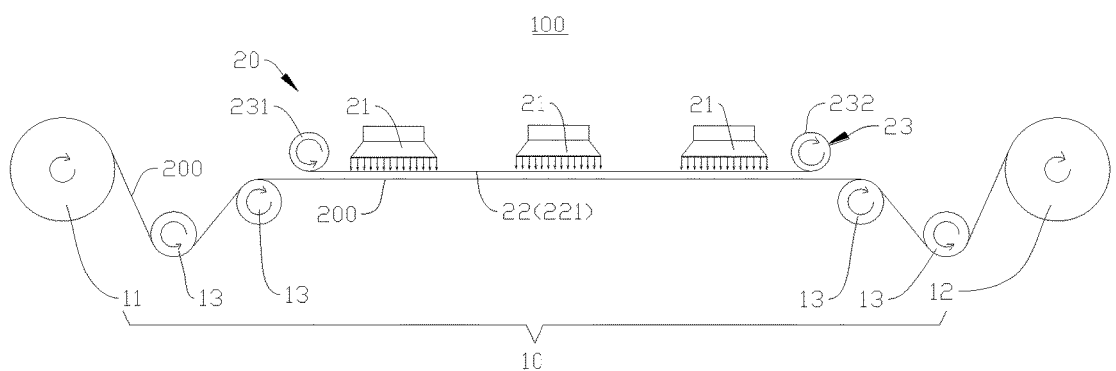
FIG. 1 is a schematic structural diagram of an exposure apparatus according to some embodiments of this application.

Signs: 100. exposure apparatus; 10. conveying mechanism; 11. discharge roller; 12. winding roller; 13. sixth drive roller; 20. exposure mechanism; 21. exposure source; 22. exposure member; 221. exposure section; 222. light-transmitting portion; 223. light-shielding portion; 23. drive assembly; 231. first drive roller; 232. second drive roller; 233. third drive roller; 234. fourth drive roller; 235. fifth drive roller; and 200. substrate.

DESCRIPTION OF EMBODIMENTS

To make the objectives, technical solutions, and advantages of the embodiments of this application clearer, the following clearly and completely describes the technical solutions in the embodiments of this application with reference to the accompanying drawings in the embodiments of this application. Apparently, the described embodiments are some but not all embodiments of this application. Generally, the components of the embodiments of this application as described and shown in the accompanying drawings herein can be arranged and designed in a variety of configurations.

Therefore, the following detailed description of the embodiments of this application as provided in the accompanying drawings is not intended to limit the scope of this application but merely to represent selected embodiments of this application. All other embodiments obtained by persons of ordinary skill in the art based on the embodiments of this application without creative efforts shall fall within the protection scope of this application.

It should be noted that, without conflict, the embodiments and features in the embodiments in this application may be combined with each other.

It should be noted that similar reference numerals and letters indicate similar items in the following drawings, and therefore once an item is defined in one drawing, it does not need to be further defined or explained in the subsequent drawings.

In the description of the embodiments of this application, it should be noted that the orientations or positional relationships as indicated are orientations or positional relationships based on the accompanying drawings, or conventional orientations or positional relationships of products of this application, or orientations or positional relationships as conventionally understood by persons skilled in the art, and the orientations or positional relationships as indicated are merely for case and brevity of description of this application rather than indicating or implying that the apparatuses or elements mentioned must have specific orientations or must be constructed or manipulated according to specific orientations, and therefore cannot be understood as limitations on this application. In addition, the terms "first", "second", "third", and the like are merely intended for distinguishing purposes and shall not be understood as any indication or implication of relative importance.

Currently, from a perspective of the market development, application of traction batteries is being more extensive. Traction batteries have been not only used in energy storage power supply systems such as hydroelectric power plants, thermal power plants, wind power plants, and solar power plants, but also widely used in many other fields including electric transportation tools such as electric bicycles, electric motorcycles, and electric vehicles, military equipment, and aerospace. With continuous expansion of application fields of traction batteries, market demands for the traction batteries are also expanding.

The battery mentioned in the embodiments of this application is a single physical module that includes one or more battery cells for providing a higher voltage and capacity. For example, the battery mentioned in this application may include a battery module, a battery pack, or the like. A battery typically includes a box configured to enclose one or more battery cells. The box can prevent liquids or other foreign matter from affecting charging or discharging of the battery cell.

The battery cell includes an electrode assembly. The electrode assembly includes a positive electrode plate, a negative electrode plate, and a separator. Working of the battery cell mainly relies on migration of metal ions between the positive electrode plate and the negative electrode plate.

The positive electrode plate includes a positive electrode current collector and a positive electrode active substance layer. The positive electrode active substance layer is coated on a surface of the positive electrode current collector. The part of positive electrode current collector uncoated with the positive electrode active substance layer protrudes out of the part of positive electrode current collector coated with the positive electrode active substance layer and serves as a positive tab. A lithium-ion battery is used as an example, for which, the positive electrode current collector may be made of aluminum and the positive electrode active substance may be lithium cobaltate, lithium iron phosphate, ternary lithium, lithium manganate, or the like. The negative electrode plate includes a negative electrode current collector and a negative electrode active substance layer. The negative electrode active substance layer is coated on a surface of the negative electrode current collector. The part of negative electrode current collector uncoated with the negative electrode active substance layer protrudes out of the part of negative electrode current collector coated with the negative electrode active substance layer and serves as a negative tab. The negative electrode current collector may be made of copper, and the negative electrode active substance may be carbon, silicon, or the like. To allow a large current to pass through without any fusing, multiple positive tabs are provided and stacked together, and multiple negative tabs are provided and stacked together. The separator may be made of PP (polypropylene, polypropylene), PE (polyethylene, polyethylene), or the like. In addition, the electrode assembly may be a wound structure or a stacked structure. However, the embodiments of this application are not limited thereto.

In practice, for purposes such as improving the stability of the combination of the active substance layer and the current collector and applying more active substances, a recess needs to be formed on the surface of the current collector, and part of the active substance layer is accommodated in the recess. A typical method of forming a recess on the surface of the current collector is as follows: a photoresist layer is coated on the surface of the current collector, covered with a processed mask film, and exposed by an exposure source, and after the pattern on the mask film is developed on the photoresist, the current collector is etched to form the recess on the surface of the current collector.

The inventors have found that in the exposure processing of a current collector coated with photoresist, the mask film is fixed between the exposure source and the current collector, and after the exposure of one current collector is completed, the current collector is transferred, and then the next current collector that needs to be exposed is conveyed to the exposure position. This process is not only inefficient, but also requires adjustment of the position of the current collector with respect to the mask film and the exposure source each time to ensure the accuracy of the exposure patterns on the current collector. Therefore, existing exposure technologies cannot guarantee the efficiency and the accuracy of exposure patterns.

Based on the above considerations, in order to solve the problems of low efficiency and poor exposure pattern consistency in the exposure of the current collectors, the inventors, after in-depth research, designed an exposure apparatus, where the part of the exposure member provided with the light-shielding portion and the light-transmitting portion moves in synchronization with the substrate, implementing exposure processing by the exposure mechanism during conveying of the substrate, thus improving the exposure efficiency. In addition, the light-shielding portion and the light-transmitting portion move in synchronization with the substrate. During conveying of the substrate, the light-shielding portion and the light-transmitting portion remain stationary relative to the substrate, which ensures that the patterns on the exposure member are fully exposed to the substrate at a high speed with good pattern consistency, thus improving the exposure quality.

The exposure apparatus disclosed in the embodiments of this application may, but is not limited to, be used for manufacturing a current collector for electrode plates. It can also be used for graphic processing operations in fields such as display panels, integrated circuits, and semiconductors to improve the exposure efficiency, increase the productivity, and ensure good pattern consistency.

Refer to FIG. 1. FIG. 1 is a schematic structural diagram of an exposure apparatus 100 according to some embodiments of this application. The exposure apparatus 100 includes a conveying mechanism 10 and an exposure mechanism 20. The conveying mechanism 10 is configured to convey a substrate 200, a surface of the substrate 200 being coated with photoresist. The exposure mechanism 20 includes an exposure source 21 and an exposure member 22, the exposure source 21 being configured to provide light to the substrate 200; and the exposure member 22 including an exposure section 221 opposite the substrate 200, where the exposure section 221 is located between the exposure source 21 and the substrate 200 and disposed in close proximity to the substrate 200, the exposure section 221 has a light-transmitting portion 222 (shown in FIG. 5) that allows light to be incident on the substrate 200 and a light-shielding portion 223 (shown in FIG. 5) that prevents light from being incident on the substrate 200, and the exposure section 221 is configured to keep the light-transmitting portion 222 and the light-shielding portion 223 in synchronized movement with the substrate 200.

Photoresist, also known as photosensitive resist, refers to a resist etching thin film material that undergoes a change in solubility when exposed to or irradiated by ultraviolet light, electron beams, ion beams, X-rays, or the like. The photoresist may be a light-sensitive liquid mixture primarily composed of a photosensitive resin, a sensitizer, and a solvent. With a suitable selective photoresist, a desired pattern can be obtained on a surface. In some embodiments, after the photoresist is exposed and developed, the exposed portion of the photoresist is dissolved and the unexposed portion is retained. This class of photoresist is positive photoresist. In other embodiments, it may also be that after the photoresist is exposed and developed, the exposed portion is retained and the unexposed portion is dissolved. This class of photoresist is negative photoresist.

Exposure is to use light to project patterns on a mask film onto the photoresist through an optical system to achieve pattern transfer. For the exposure apparatus 100 provided in the embodiments of this application, the exposure member 22 is equivalent to the mask film, and the pattern on the mask film is formed by the shape of the light-shielding portion 223, the shape of the light-transmitting portion 222, or a combination of the shapes of the light-shielding portion 223 and the light-transmitting portion 222; and the optical system is the exposure source 21. It should be understood that the exposure apparatus 100 in the embodiments of this application uses light from the exposure source 21 to project the pattern defined by the light-shielding portion 223 and/or the light-transmitting portion 222 on the exposure member 22 onto the photoresist on the surface of the substrate 200 after the patterns are irradiated by the exposure source 21.

The light-transmitting portion 222 allows light from the exposure source 21 to pass through and irradiate the photoresist on the substrate 200, and the light-shielding portion 223 prevents light from the exposure source 21 from passing through the exposure member 22 to irradiate the photoresist on the substrate 200. If the photoresist is a positive photoresist, the portion of the photoresist that is irradiated by the light transmitted through the light-transmitting portion 222 is dissolved to form a pattern that is consistent with the shape of the light-transmitting portion 222, and the portion of the photoresist that corresponds to the light-shielding portion 223 is retained. If the photoresist is a negative photoresist, the portion of the photoresist that is irradiated by the light transmitted through the light-transmitting portion 222 is retained; and the portion of the photoresist that corresponds to the light-shielding portion 223 is dissolved to form a pattern that is consistent with the shape of the light-shielding portion 223.

The substrate 200 may be a current collector (a positive electrode current collector or a negative electrode current collector), a circuit board, and the like.

The exposure section 221 is located between the exposure source 21 and the substrate 200 to allow light from the exposure source 21 to pass through the light-transmitting portion 222 on the exposure member 22 and irradiate the photoresist on the substrate 200. The exposure member 22 is disposed in close proximity to the substrate 200. The spacing between the exposure member 22 and the substrate 200 is small so that the shape of the pattern on exposure section 221 projected onto the substrate 200 closely approximates the shape of the pattern on the exposure section 221, resulting in better pattern consistency.

The exposure section 221 is configured to keep the light-transmitting portion 222 and the light-shielding portion 223 in synchronized movement with the substrate 200, meaning that during the conveying of the substrate 200 by the conveying mechanism 10 at a certain speed, the exposure section 221 causes the light-shielding portion 223 and the light-transmitting portion 222 to move at the same speed as the conveying speed of the substrate 200, so as to keep the light-shielding portion 223 and the light-transmitting portion 222 stationary relative to the substrate 200.

The part of the exposure member 22 provided with the light-shielding portion 223 and the light-transmitting portion 222 moves in synchronization with the substrate 200, implementing exposure processing by the exposure mechanism 20 during conveying of the substrate 200, thus improving the exposure efficiency. In addition, the light-shielding portion 223 and the light-transmitting portion 222 move in synchronization with the substrate 200. During conveying of the substrate 200, the light-shielding portion 223 and the light-transmitting portion 222 remain stationary relative to the substrate 200, which ensures that the patterns on the exposure member 22 are fully exposed to the substrate 200 at a high speed with good pattern consistency, thus improving the exposure quality.

There are various ways for the exposure section 221 to keep the light-transmitting portion 222 and the light-shielding portion 223 in synchronized movement with the substrate 200. For example, still referring to FIG. 1, in some embodiments, the exposure mechanism 20 further includes a drive assembly 23, the drive assembly 23 being configured to drive the exposure member 22 to move to keep the light-transmitting portion 222 and the light-shielding portion 223 in synchronized movement with the substrate 200.

The drive assembly 23 and the conveying mechanism 10 are independent of each other and can be controlled independently. For example, if a portion of the substrate 200 requires a shorter exposure time, the conveying mechanism 10 or the drive assembly 23 can be controlled to stop working when the portion is conveyed by the conveying mechanism 10 to the position opposite the exposure section 221.

In other embodiments, the exposure member 22 may also be driven by the conveying mechanism 10, that is, the conveying mechanism 10 is configured to convey the substrate 200 and to drive the exposure member 22 to move to keep the light-transmitting portion 222 and the light-shielding portion 223 in synchronized movement with the substrate 200.

The exposure member 22 is driven to move by the drive assembly 23, which facilitates independent control of the movement of the exposure member 22 and improves the flexibility of controlling various components of the exposure apparatus 100.

The drive assembly 23 may be in various structural forms. For example, referring to FIG. 1, in some embodiments, the drive assembly 23 includes a first drive roller 231 and a second drive roller 232 spaced apart, the exposure member 22 is wound around the first drive roller 231 and the second drive roller 232, and the exposure member 22 forms an exposure section 221 between the first drive roller 231 and the second drive roller 232.

That the exposure member 22 is wound around the first drive roller 231 and the second drive roller 232 may be: one end of the exposure member 22 is wound around the first drive roller 231 and the other end of the exposure member 22 is wound around the second drive roller 232. One of the first drive roller 231 and the second drive roller 232 is configured to release the exposure member 22 wound thereon, and the other is configured to wind the exposure member 22. FIG. 1 shows that the first drive roller 231 is used for releasing the exposure member 22 and the second drive roller 232 is used for winding the exposure member 22.

That the exposure member 22 is wound around the first drive roller 231 and the second drive roller 232 may alternatively be: the exposure member 22 is in contact with a part of the outer peripheral surface of the first drive roller 231 and the exposure member 22 is in contact with a part of the outer peripheral surface of the second drive roller 232.

The distance at which each portion of the substrate 200 moves in synchronization with the light-shielding portion 223 and light-transmitting portion 222 on the exposure section 221 is the length of the exposure section 221 and also the distance between the first drive roller 231 and the second drive roller 232.

The exposure member 22 is wound around the first drive roller 231 and the second drive roller 232, and the first drive roller 231 and the second drive roller 232 cooperate to drive the exposure member 22 to move, which can improve the stability of the movement of the exposure member 22, and is helpful to ensure that the patterns on the exposure member 22 are fully exposed to the substrate 200 at a high speed, resulting in good pattern consistency. An exposure section 221 is formed between the first drive roller 231 and the second drive roller 232, and the light-shielding portion 223 and the light-transmitting portion 222 located on the exposure section 221 synchronously move relative to the substrate 200 for the same distance and time, so as to make the exposure time of each part of the substrate 200 the same, thus improving the consistency of exposure patterns.

Figure 2:
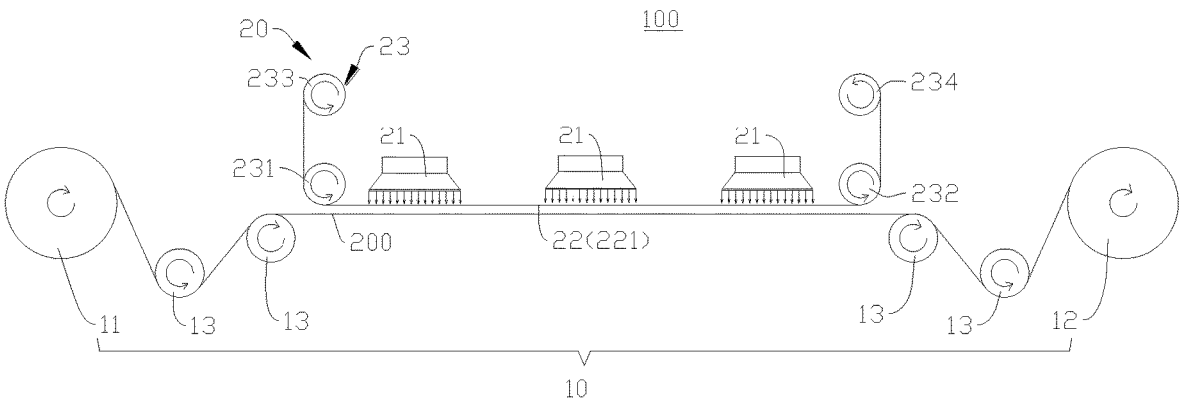
FIG. 2 is a schematic structural diagram of an exposure apparatus according to some other embodiments of this application.

Refer to FIG. 2. FIG. 2 is a schematic structural diagram of an exposure apparatus 100 according to some other embodiments of this application. In some embodiments of this application, the drive assembly 23 further includes a third drive roller 233 and a fourth drive roller 234, the first drive roller 231, the second drive roller 232, the third drive roller 233, and the fourth drive roller 234 are distributed at four corners of a rectangle, and the exposure member 22 is wound around the first drive roller 231, the second drive roller 232, the third drive roller 233, and the fourth drive roller 234.

As shown in FIG. 2, in an embodiment in which the exposure member 22 is in contact with a part of the outer peripheral surface of the first drive roller 231, the exposure member 22 is in contact with a part of the outer peripheral surface of the second drive roller 232, and the first drive roller 231 and the second drive roller 232 rotate in the same direction, one end of the exposure member 22 is wound around the third drive roller 233 and the other end of the exposure member 22 is wound around the fourth drive roller 234. One of the third drive roller 233 and the fourth drive roller 234 is configured to release the exposure member 22 wound thereon, and the other is configured to wind the exposure member 22. In FIG. 2, the third drive roller 233 releases the exposure member 22 and the fourth drive roller 234 winds the exposure member 22, and the first drive roller 231 and the second drive roller 232 are provided downstream of the third drive roller 233 and upstream of the fourth drive roller 234. The first drive roller 231 and the second drive roller 232 are capable of assisting in the conveying of the exposure member 22 so that the exposure member 22 released from the third drive roller 233 is conveyed towards the fourth drive roller 234. The first drive roller 231 and the second drive roller 232 can also increase the tension of the exposure member 22.

Certainly, the exposure member 22 may alternatively be in contact with a part of the outer peripheral surface of the third drive roller 233 and a part of the outer peripheral surface of the fourth drive roller 234.

It should be noted that the "upstream" and "downstream" mentioned above and below in the embodiments of this application refer to the order of operation, with the upstream referring to the order of a preceding operation and the downstream referring to the order of a subsequent operation, and do not limit the spatial position between the various components.

In other embodiments, the drive assembly 23 may include only the first drive roller 231 and the second drive roller 232 but no third drive roller 233 and fourth drive roller 234.

The exposure member 22 is wound around the first drive roller 231, the second drive roller 232, the third drive roller 233, and the fourth drive roller 234, and the first drive roller 231, the second drive roller 232, the third drive roller 233, and the fourth drive roller 234 cooperate to drive the exposure member 22 to move, which can improve the stability of the movement of the exposure member 22, and is helpful to ensure that the patterns on the exposure member 22 are fully exposed to the substrate 200 at a high speed, resulting in good pattern consistency.

Figure 3:
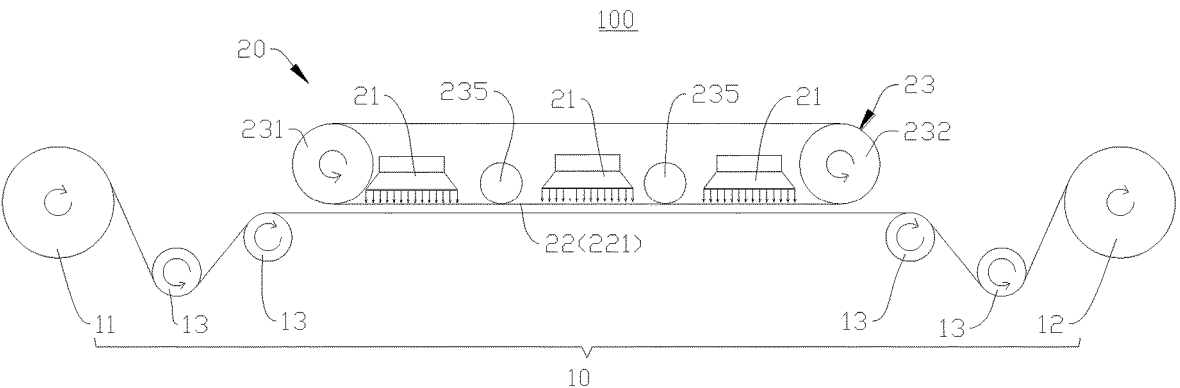
FIG. 3 is a schematic structural diagram of an exposure apparatus according to still some other embodiments of this application.
Figure 4:
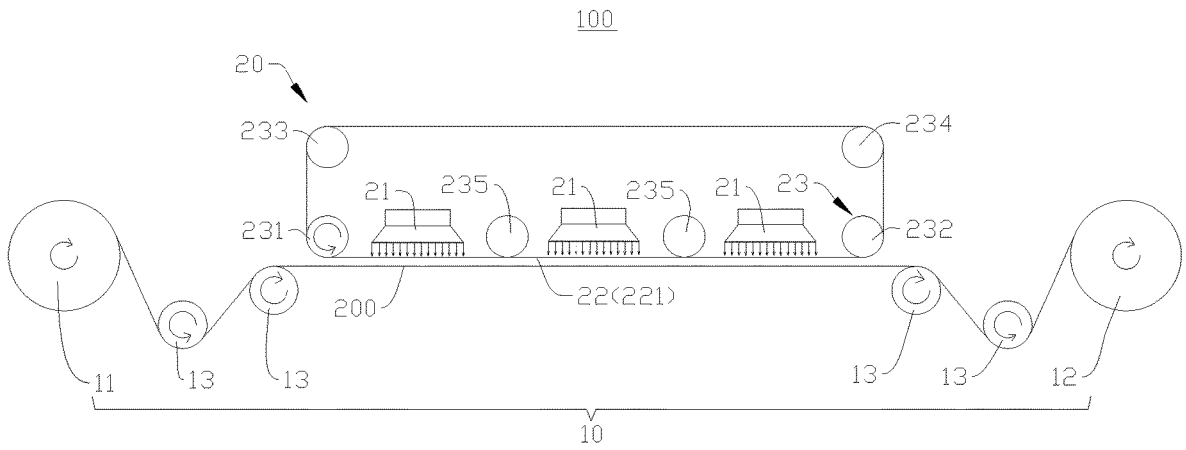
FIG. 4 is a schematic structural diagram of an exposure apparatus according to yet some other embodiments of this application.

Referring to FIGS. 3 and 4, FIG. 3 is a schematic structural diagram of an exposure apparatus 100 provided in yet some other embodiments of this application, and FIG. 4 is a schematic structural diagram of an exposure apparatus 100 provided in yet some other embodiments of this application. In some embodiments, the exposure member 22 is a closed-loop structure with ends connected.

As shown in FIG. 3, in an embodiment in which the drive assembly 23 includes only a first drive roller 231 and a second drive roller 232, the exposure member 22 is sequentially wound around the first drive roller 231 and the second drive roller 232, with the first drive roller 231 being the active roller and the second drive roller 232 being the driven roller. The first drive roller 231, the second drive roller 232, and the exposure member 22 form a belt drive mechanism, and the first drive roller 231 and the second drive roller 232 cooperate to drive the exposure member 22 to circularly drive.

As shown in FIG. 4, in an embodiment in which the drive assembly 23 includes a first drive roller 231, a second drive roller 232, a third drive roller 233, and a fourth drive roller 234, the exposure member 22 is sequentially wound around the first drive roller 231, the second drive roller 232, the third drive roller 233, and the fourth drive roller 234, with the first drive roller 231 being the active roller, and the second drive roller 232, the third drive roller 233, and the fourth drive roller 234 being the driven rollers. The first drive roller 231, the second drive roller 232, the third drive roller 233, the fourth drive roller 234 and the exposure member 22 form a belt drive mechanism, and the first drive roller 231, the second drive roller 232, the third drive roller 233, and the fourth drive roller 234 cooperate to drive the exposure member 22 to circularly drive.

The exposure member 22 is a closed-loop structure with ends connected such that the exposure member 22 moves in a circular manner, reducing the space occupied by the exposure member 22.

Continue to refer to FIGS. 3 and 4, in some embodiments, the drive assembly 23 further includes a fifth drive roller 235, the fifth drive roller 235 being provided on a side of the exposure section 221 facing back away from the substrate 200.

The fifth drive roller 235 may be provided in plurality, and plurality means two and more than two. The rotary axis of the fifth drive roller 235 may be parallel to the first drive roller 231 and the second drive roller 232. In embodiments where the fifth drive roller 235 is provided in plurality, the plurality of fifth drive rollers 235 are spaced apart. FIG. 3 shows a drive assembly 23 that includes two fifth drive rollers 235. Certainly, the drive assembly 23 may not include the fifth drive roller 235.

The fifth drive roller 235 is located on a side of the exposure section 221 facing away from the substrate 200 and is in contact with a side of the exposure section 221 facing away from the substrate 200, Thus, the fifth drive roller can cooperate with the substrate 200 to limit the shaking amplitude of the exposure section 221, thereby ensuring that the patterns on the exposure member 22 are fully exposed to the substrate 200 at a high speed with good pattern consistency.

Continue to refer to FIGS. 3 and 4. In some embodiments, the exposure source 21 is located between the first drive roller 231 and the second drive roller 232.

The exposure source 21 may be a component capable of emitting ultraviolet light, electron beams, ion beams, X-rays, and the like.

The exposure source 21 is located between the first drive roller 231 and the second drive roller 232. Thus, the space between the first drive roller 231 and the second drive roller 232 can be used efficiently, which makes the structure of the exposure mechanism 20 more compact and reduces the space occupied by the exposure mechanism 20.

In some embodiments, the exposure source 21 is provided in plurality and the plurality of exposure sources 21 are spaced apart.

In embodiments where the drive assembly 23 includes a fifth drive roller 235, at least one fifth drive roller 235 may be provided between two adjacent exposure sources 21. In other embodiments, the exposure source 21 may be provided in a quantity of onc.

The exposure source 21 is provided in plurality, which can increase the exposure arca of the substrate 200 at the same time, thereby improving the exposure efficiency.

Figure 5:
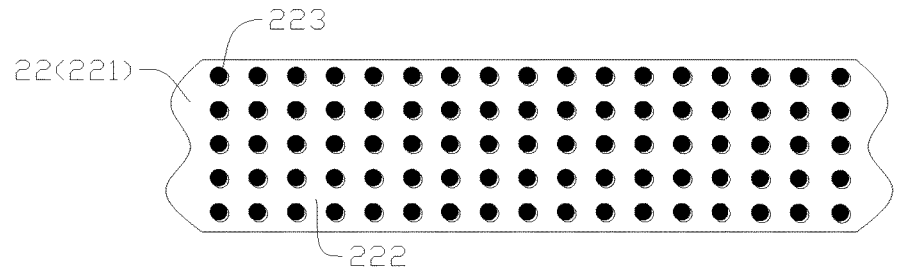
FIG. 5 is a schematic partial diagram of an exposure member according to some embodiments of this application.

Referring to FIG. 5, FIG. 5 is a schematic partial diagram of an exposure member 22 according to some embodiments of this application. In some embodiments, the light-shielding portion 223 is provided in plurality, and the plurality of light-shielding portions 223 are arranged in a rectangular array.

In FIG. 5, the shape of the light-shielding portion 223 is circular. In other embodiments, the shape of the light-shielding portion 223 may also be in other forms, and the shape of the light-shielding portion 223 may be configured according to actual needs. The quantity and arrangement of the light-shielding portion 223 may also be adjusted according to actual needs.

The plurality of light-shielding portions 223 are arranged in a rectangular array, so that a relatively regular pattern can be formed on the substrate 200 after exposure by the exposure source 21. This facilitates determining whether the patterns on the exposure member 22 are fully exposed to the substrate 200 and whether the pattern consistency meets the requirements.

Figure 6:
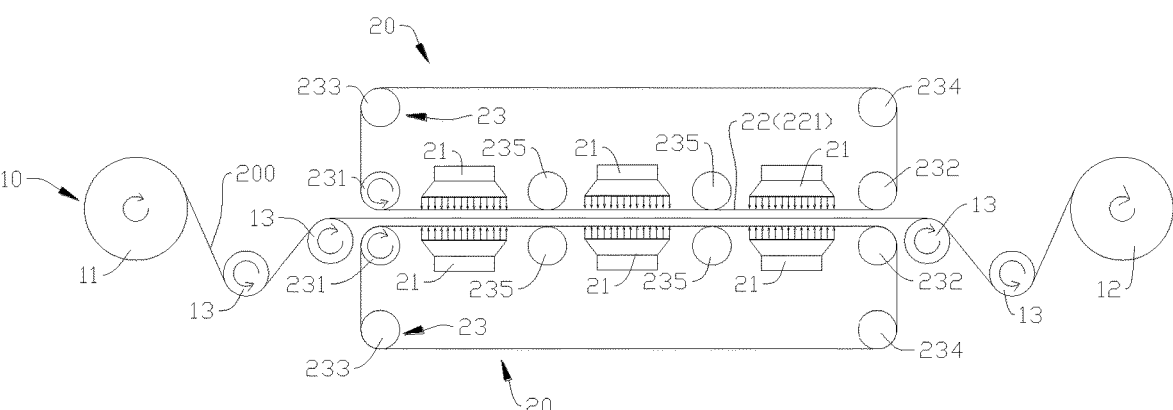
FIG. 6 is a schematic structural diagram of an exposure apparatus according to still yet some other embodiments of this application.

Refer to FIG. 6. FIG. 6 is a schematic structural diagram of an exposure apparatus 100 according to still yet some other embodiments of this application. In some embodiments, the exposure mechanism 20 is provided in a quantity of two, and the two exposure mechanisms 20 are located on two sides of the substrate 200, respectively.

The structures of the two exposure mechanisms 20 may be the same or different. The two exposure mechanisms 20 are provided on two opposite sides of the substrate 200, respectively. The two exposure mechanisms 20 may operate simultaneously or only one of them operates.

The two exposure mechanisms 20 are respectively located on two sides of the substrate 200, which enables exposure on both sides of the substrate 200 during the substrate 200 conveying process and improves the exposure efficiency.

The conveying mechanism 10 has various structural forms. For example, in some embodiments, the conveying mechanism 10 includes a discharge roller 11 and a winding roller 12. The discharge roller 11 is configured to release the substrate 200, the winding roller 12 is provided downstream of the discharge roller 11, and the discharge roller 11 is configured to wind the substrate 200 released by the discharge roller 11.

In other embodiments, the conveying mechanism 10 may also be driven by other means. For example, the conveying mechanism 10 is a belt drive mechanism.

The discharge roller 11 and the winding roller 12 cooperate in conveying the substrate 200, which can improve stability of the substrate 200 conveying and realize exposure processing by the exposure mechanism 20 during conveying of the substrate 200, thus improving the exposure efficiency.

In some embodiments, the conveying mechanism 10 further includes a sixth drive roller 13. The sixth drive roller 13 is provided downstream of the discharge roller 11 and upstream of the winding roller 12, and the sixth drive roller 13 is configured to convey the substrate 200 from the discharge roller 11 to the winding roller 12.

The sixth drive roller 13 may be provided in a quantity of one or more. The rotary axis of the sixth drive roller 13, the rotary axis of the discharge roller 11, and the rotary axis of the winding roller 12 are parallel.

The sixth drive roller 13 is able to support the substrate 200 located between the discharge roller 11 and the winding roller 12, reducing the risk of the substrate 200 being torn due to gravity during the conveying process. The provision of the sixth drive roller 13 can also increase the tension of the substrate 200 and improve the stability of the conveying of the substrate 200.

In some embodiments, the substrate 200 is a current collector coated with photoresist, the exposure member 22 is a mask film, and/or the exposure source 21 is an ultraviolet light source.

The substrate 200 varies depending on the application environment of the exposure apparatus 100. In other embodiments, the ultraviolet light source may also be replaced with other forms of exposure source 21, such as by an X-ray source, an electron beam emission source, an ion beam emission source, and the like.

The substrate 200 is a current collector coated with photoresist. Using the exposure apparatus 100 to carry out exposure processing can improve the production efficiency of the electrode plate. The exposure member 22 is a mask film and the exposure source 21 is an ultraviolet light source, both of which are low-cost and easily obtainable components, thus reducing the production cost.

Referring to FIG. 6, an embodiment of this application provides an exposure apparatus 100, the exposure apparatus 100 includes a conveying mechanism 10 and two exposure mechanisms 20. The conveying mechanism 10 includes a discharge roller 11, a winding roller 12, and a plurality of sixth drive rollers 13. The winding roller 12 is provided downstream of the discharge roller 11. The plurality of sixth drive rollers 13 are provided downstream of the discharge roller 11 and upstream of the winding roller 12. The discharge roller 11 is configured to release the substrate 200. The winding roller 12 is configured to wind the substrate 200. The plurality of sixth drive rollers 13 are configured to transfer the substrate 200 released from the discharge roller 11 towards the winding roller 12.

The two exposure mechanisms 20 are provided on two opposite sides of the substrate 200, respectively. The exposure mechanism 20 includes a plurality of exposure sources 21, an exposure member 22, and a drive assembly 23. The exposure source 21 is configured to provide light to the substrate 200. The exposure member 22 includes an exposure section 221 opposite the substrate 200, the exposure section 221 being located between the exposure source 21 and the substrate 200 and disposed in close proximity to the substrate 200. The exposure section 221 has a light-shielding portion 223 and a light-transmitting portion 222, where the light-transmitting portion 222 allows light to be incident to the substrate 200, and the light-shielding portion 223 prevents light from being incident to the substrate 200. The drive assembly 23 is configured to drive the exposure member 22 to move to keep the light-transmitting portion 222 and the light-shielding portion 223 in synchronized movement with the substrate 200.

The drive assembly 23 includes a first drive roller 231, a second drive roller 232, a third drive roller 233, and a fourth drive roller 234 arranged at the four corners of a rectangle, the first drive roller 231 being the active roller, and the second drive roller 232, the third drive roller 233, and the fourth drive roller 234 being the driven rollers. The exposure member 22 is a closed-loop structure sequentially wound around the first drive roller 231, the second drive roller 232, the third drive roller 233, and the fourth drive roller 234. The first drive roller 231 rotates to drive the second drive roller 232, the third drive roller 233, and the fourth drive roller 234 to rotate through the exposure member 22, thereby implementing the cyclic drive of the exposure member 22. The plurality of exposure sources 21 are provided between the first drive roller 231 and the second drive roller 232, and are located in a rectangular space defined by the first drive roller 231, the second drive roller 232, the third drive roller 233, and the fourth drive roller 234 to reduce the space occupied by the exposure mechanism 20.

The drive assembly 23 further includes a plurality of fifth drive rollers 235. The plurality of fifth drive rollers 235 is spaced apart on and in contact with a side of the exposure section 221 facing away from the substrate 200. Thus, the fifth drive rollers, jointly with the substrate 200, limit the shaking amplitude of the exposure section 221.

The foregoing descriptions are merely some embodiments of this application which are not intended to limit this application. Persons skilled in the art understand that this application may have various modifications and variations. Any modifications, equivalent replacements, and improvements made without departing from the spirit and principle of this application shall fall within the protection scope of this application.

What is claimed is:

1. An exposure apparatus comprising:
a conveying mechanism configured to convey a substrate, a surface of the substrate being coated with photoresist; and
an exposure mechanism, comprising:
a plurality of exposure sources spaced apart from each other and configured to provide light to the substrate;
an exposure member comprising an exposure section opposite the substrate, wherein the exposure section is located between the exposure source and the substrate, the exposure section has a light-transmitting portion that allows light to be incident on the substrate and a light-shielding portion that prevents light from being incident on the substrate, and the exposure section is configured to keep the light-transmitting portion and the light-shielding portion in synchronized movement with the substrate; and
a drive assembly configured to drive the exposure member to move to keep the light-transmitting portion and the light-shielding portion in synchronized movement with the substrate, and comprising:
a first drive roller and a second drive roller spaced apart, the exposure member being wound around the first drive roller and the second drive roller, and a part of the exposure member between the first drive roller and the second drive roller forming the exposure section; and
a plurality of third drive rollers provided on a side of the exposure section facing away from the substrate, at least one of the plurality of third drive rollers being provided between two adjacent exposure sources of the plurality of exposure sources.

2. The exposure apparatus according to claim 1, wherein the drive assembly further comprises a fourth drive roller and a fifth drive roller, the first drive roller, the second drive roller, the fourth drive roller, and the fifth drive roller are distributed at four corners of a rectangle, and the exposure member is wound around the first drive roller, the second drive roller, the fourth drive roller, and the fifth drive roller.

3. The exposure apparatus according to claim 1, wherein the exposure member is a closed-loop structure with ends connected.

4. The exposure apparatus according to claim 1, wherein the light-shielding portion is one of a plurality of light-shielding portions arranged in a rectangular array.

5. The exposure apparatus according to claim 1, wherein the exposure mechanism is one of two exposure mechanisms located on two sides of the substrate, respectively.

6. The exposure apparatus according to claim 1, wherein the conveying mechanism comprises a discharge roller and a winding roller, the discharge roller being configured to release the substrate, the winding roller being provided downstream of the discharge roller, and the winding roller being configured to wind the substrate released by the discharge roller.

7. The exposure apparatus according to claim 6, wherein the conveying mechanism further comprises a fourth drive roller, the fourth drive roller being provided downstream of the discharge roller and upstream of the winding roller, and the fourth drive roller being configured to convey the substrate from the discharge roller to the winding roller.

8. The exposure apparatus according to claim 1, wherein the substrate is a current collector coated with photoresist, the exposure member is a mask film, and/or the exposure source is an ultraviolet light source.

9. The exposure apparatus according to claim 1,
wherein the exposure mechanism is a first mechanism,
the exposure apparatus further comprising:
  a second exposure mechanism, the first exposure
    mechanism and the second exposure mechanism 5
    being located on two opposite sides of the substrate,
    a structure of the second exposure mechanism being
    different from a structure of the first exposure
    mechanism, and the first exposure mechanism and
    the second exposure mechanism being configured to 10
    operate simultaneously.

\*    \*    \*    \*    \*